(12) United States Patent
Waldrop

(10) Patent No.: US 10,838,799 B2
(45) Date of Patent: Nov. 17, 2020

(54) PARALLEL ERROR CALCULATION

(71) Applicant: Micron Technology, Inc., Boise, ID (US)

(72) Inventor: William C. Waldrop, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 95 days.

(21) Appl. No.: 16/105,338

(22) Filed: Aug. 20, 2018

(65) Prior Publication Data

US 2020/0057688 A1 Feb. 20, 2020

(51) Int. Cl.
  G06F 11/00 (2006.01)
  G06F 11/07 (2006.01)
  H03K 21/38 (2006.01)
  H03K 5/00 (2006.01)

(52) U.S. Cl.
  CPC .......... G06F 11/079 (2013.01); G06F 11/073 (2013.01); H03K 21/38 (2013.01); H03K 2005/00013 (2013.01); H03K 2005/00234 (2013.01)

(58) Field of Classification Search
  None
  See application file for complete search history.

(56) References Cited

U.S. PATENT DOCUMENTS

| | | | | |
|---|---|---|---|---|
| 5,043,990 A * | 8/1991 | Doi | .......................... | G06F 11/10 714/48 |
| 2003/0131301 A1* | 7/2003 | Shimono | ................... | H04L 7/04 714/752 |
| 2004/0052321 A1* | 3/2004 | Sakai | .................... | H04J 3/0629 375/354 |
| 2009/0094507 A1* | 4/2009 | Nakase | ............... | H03M 13/091 714/807 |
| 2009/0106631 A1* | 4/2009 | Shigihara | ............ | H03M 13/091 714/781 |

(Continued)

OTHER PUBLICATIONS

A. Popplewell, J. J. O'Reilly and S. Williams, "Architectures for fast encoding and error detection of cyclic codes," in IEE Proceedings I—Communications, Speech and Vision, vol. 139, No. 3, pp. 340-348, Jun. 1992, doi: 10.1049/ip-i-2.1992.0047. (Year: 1992).*

*Primary Examiner* — Daniel F. McMahon
(74) *Attorney, Agent, or Firm* — Fletcher Yoder, P.C.

(57) ABSTRACT

Devices and methods for error checking transmissions include using error checking circuitry configured to receive a clock and reset. The error checking circuitry (ECC) includes an input counter configured to receive the clock and to count out multiple input clocks from the received clock. The ECC also includes a delay model configured to receive the clock and to output a delayed clock. Also, the ECC includes an output counter configured to receive the delayed clock and to count out multiple output clocks from the received delayed clock. Furthermore, the ECC includes multiple error calculation circuits arranged in parallel that each are configured to: receive data based on a respective input clock, generate an error indicator based on the received data with the error indicator indicating whether an error exists in the received data, and output the error indicator based at least in part on a respective output clock.

20 Claims, 5 Drawing Sheets

(56) References Cited

U.S. PATENT DOCUMENTS

| | | | |
|---|---|---|---|
| 2010/0058154 A1* | 3/2010 | Sezer | H03M 13/091 |
| | | | 714/807 |
| 2010/0128801 A1* | 5/2010 | Hashimoto | H04N 19/70 |
| | | | 375/240.25 |
| 2013/0214833 A1* | 8/2013 | Kim | G11C 7/1066 |
| | | | 327/156 |
| 2019/0296723 A1* | 9/2019 | Tang | H03K 5/133 |

\* cited by examiner

PARALLEL ERROR CALCULATION

BACKGROUND

Field of the Present Disclosure

Embodiments of the present disclosure relate generally to the field of electrical devices. More specifically, embodiments of the present disclosure relate to using parallel calculation circuitries to detect whether errors exist in transmitted data.

Description of Related Art

Electrical transmissions may be subject to noise that may introduce errors between a transmitter/source and a receiver. The data may be checked using error detection circuitry to determine whether errors exist in the electrical transmissions using parity calculations, error control codes (ECC), checksums, or cyclic redundancy checks. However, the error detection circuitry may process relatively large amounts of data. To process the data, the error checking circuitry may utilize multiple error calculation sub-circuits. However, the inclusion of the multiple calculation sub-circuits may be difficult to clock using a clock for the error detection circuitry. For example, the clock may be too slow to utilize the multiple calculation sub-circuits as a unit and/or may be too fast for an individual calculation sub-circuit to process a first chunk of data before inputting a next chunk of data.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously noted, received data may be error checked for errors introduced during transmission of the data. To accomplish this, a device including a receiver that receives a transmission may include error checking circuitry. The error checking circuitry may be applied to inter-device transmissions and/or intra-device transmissions. The error checking circuitry may utilize error calculators that are arranged in series and/or in parallel. In embodiments where at least some of the error calculators are in parallel, a clock may be delayed by a delay model that emulates a slowest path through the parallel error calculators. The undelayed clock may be split into multiple input clocks using an input counter. Each input clock causes data to be submitted to a corresponding parallel error calculator. The delayed clock may also be split into multiple output clocks using an output counter. Each output clock causes an error result to be passed out of a corresponding parallel error calculator. Since each output clock corresponds to an input clock with the delay added by the delay model, the output clock does not latch out the error result before processing is complete.

Figure 1:
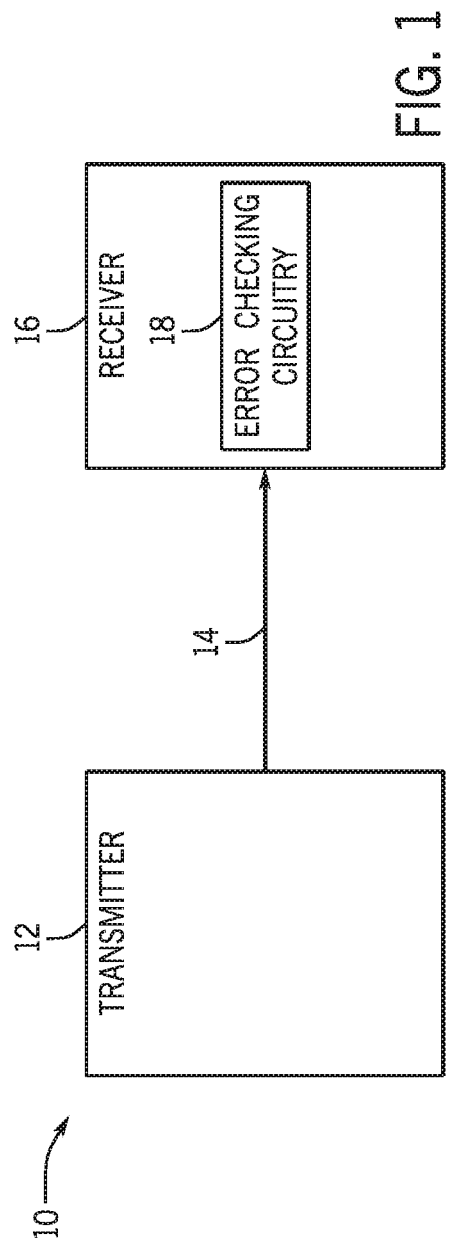
FIG. 1 is a simplified block diagram illustrating certain features of a semiconductor device having error checking circuitry, in accordance with an embodiment.

Turning now to the figures, FIG. 1 is a simplified block diagram illustrating certain features of a system 10. The system 10 includes a transmitter 12 that transmits data 14 to a receiver 16. In some embodiments, the transmitter 12 and the receiver 16 may be transceivers that communicate bi-directionally. In accordance with one embodiment, the transmitter 12 and/or the receiver 16 may be located in a memory device. For instance, the transmitter 12 and/or the receiver may include a double-data rate type 4 (DDR4) or type 5 (DDR5) synchronous dynamic random access memory (SDRAM) device. In certain embodiments, the transmitter 12 is a host device/processor coupled to a memory device as the receiver 16. In such embodiments, the data 14 may include command signals and/or address signals from the host device/processor. Alternatively, the transmitter 12 and the receiver 16 may be both located within a memory device and, together, are configured to transmit data between locations in memory device.

The receiver 16 (or the device that includes the receiver 16) also includes error checking circuitry 18 that is configured to detect errors in the data 14. For instance, the error checking circuitry 18 may include parity calculation circuitry, error control code (ECC) circuitry, checksum circuitry, cyclic redundancy check (CRC) circuitry, and/or other circuitry configured to process the data 14 to determine whether the data 14 had errors introduced during transmission of the data 14. In some embodiments, the type of error checking may be determined by a specification (e.g., DDR4 or DDR5) for the memory device (e.g., SDRAM) including the receiver 16.

Figure 2:
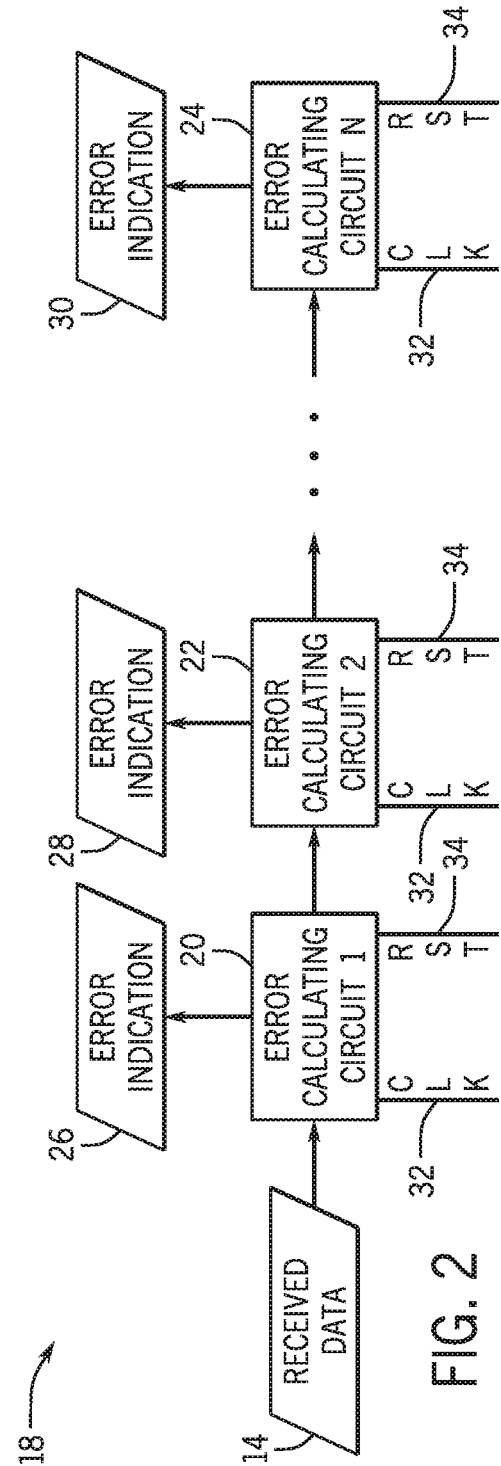
FIG. 2 is a simplified block diagram of the error checking circuitry of FIG. 1 with serially connected error calculation circuits, in accordance with an embodiment.

FIG. 2 is a simplified block diagram of a series-based embodiment of the error checking circuitry 18. As illustrated, the error checking circuitry 18 receives the data 14 at an error calculation circuit 20 that is in series with error calculation circuits 22 and 24. The error calculation circuits 20, 22, and 24 may include parity calculators, CRC calculators, ECC calculators, checksum calculators, or other calculators corresponding to the error checking type of the error checking circuitry 18. The error checking circuitry 18 may include any number of error calculation circuits 20, 22, and 24. Based on the data 14, each of the error calculation circuits 20, 22, and 24 may respectively generate error indications 26, 28, and 30 based on whether the error calculation circuits 20, 22, and 24 detect an error in the data 14.

In certain embodiments, transmission of the error indications 26, 28, and 30 by the error calculation circuits 20, 22, and 24 may be synchronously driven using a clock 32. Using the clock 32 for each of the error calculation circuits 20, 22, and 24 enables outputting of the error indications 26, 28, and 30 at expected times, but using a single clock may not fully utilize each error calculation circuit 20, 22, and 24 causing at least some of the error calculation circuits 20, 22, and 24 to wait for a next clock signal to process a next block of the data 14. Each of the error calculation circuits 20, 22, and 24 may also receive a reset signal 34 that may be used to reset circuitry (e.g., latches) of the error calculation circuits 20, 22, and 24.

Figure 3:
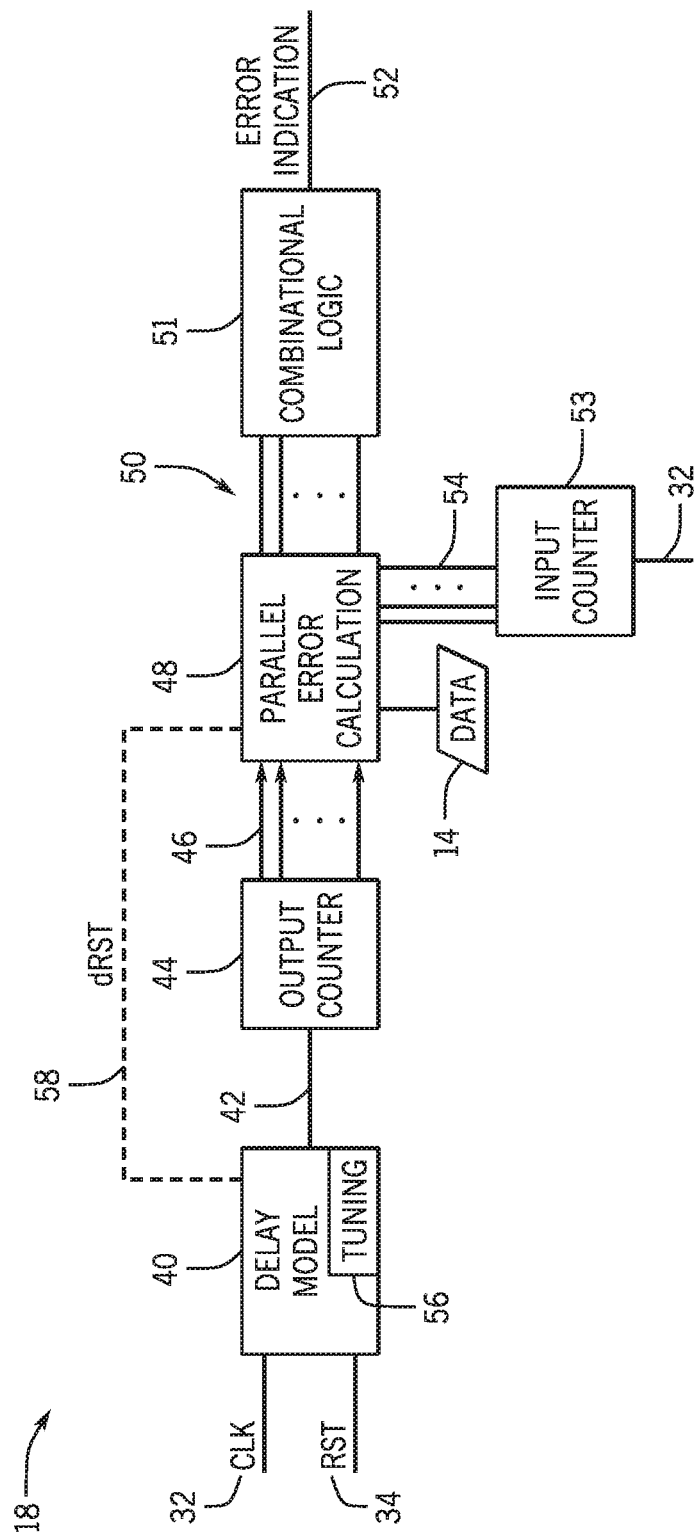
FIG. 3 is a simplified block diagram of the error checking circuitry of FIG. 1 with parallel error calculation circuitry, in accordance with an embodiment.

FIG. 3 is a simplified block of a parallel-based embodiment of the error checking circuitry 18. As illustrated, the error checking circuitry 18 includes a delay model 40 that delays the clock 32 to generate a delayed clock 42. The delayed clock 42 is then transmitted to an output counter 44 that counts successive edges of the delayed clock 42 to divide the delayed clock 42 into delayed output clocks 46. Each of the output clocks 46 is transmitted to a corresponding parallel error calculation circuitry 48 to generate respective indications 50 indicating whether the parallel error calculation circuitry 48 has detected an error in the data 14. The respective indications 50 may be combined using combinational logic 51 that may combine the respective indications 50 from individual calculators of the parallel error calculation circuitry 48 to generate a single error indication signal 52. In some embodiments, the combinational logic 51 may include an OR operation implemented using one or more logic gates. For example, the combinational logic 51 may output a logic high for the error indication signal 52 if at least one of the respective indications 50 is a logic high.

As discussed below, the parallel error calculation circuitry 48 also utilizes the clock 32 that is received at an input counter 53 to count successive edges of the clock 32 to divide the clock 32 into input clocks 54. Since the output counter 44 counts successive edges of the clock 32 after delaying the clock 32 to the delayed clock 42 and the input counter 53 counts successive edges of the clock 32 without delaying in the delay model 40, each of the input clocks 54 corresponds to one of the output clocks 46 generated with a delay from each respective input clock 54 to the corresponding output clock 46, where the delay is introduced by the delay model 40.

The delay model 40 that includes combinational logic/circuitry models a slowest path of output for the parallel error calculation circuitry 48. For example, in some embodiments, a slowest path through circuitry of the parallel error calculation circuitry 48 may be copied verbatim to the delay model 40 from the parallel error calculation circuitry 48 with an input to the slowest path tied to the clock 32. Alternatively, the slowest path may be modeled in the delay model with all other paths tied to a particular value that waits on propagation of the clock 32 via the slowest path. For example, if an AND gate receives one input from the slowest path, other inputs to the AND gate may be tied high such that a transition of the slowest path at the AND gate high propagates a transition through the AND gate.

In some embodiments, the delay model 40 may include fine tuning circuitry 56 that may be used to add additional delays to account for process differences between devices that include the delay model 40. Furthermore, in certain embodiments, the fine tuning circuitry 56 may be programmable. For instance, the number of delaying gates used in a delay may be selectable as less than a total number of available delaying gates in the fine tuning circuitry 56.

In some embodiments, the delay model 40 may also generate a delayed reset signal 58 based on the reset signal 34. As discussed below, the delayed reset signal 58, when utilized, may reset output registers of the parallel error calculation circuitry 48 while an undelayed reset signal 34 may be used to reset input registers.

Figure 4:
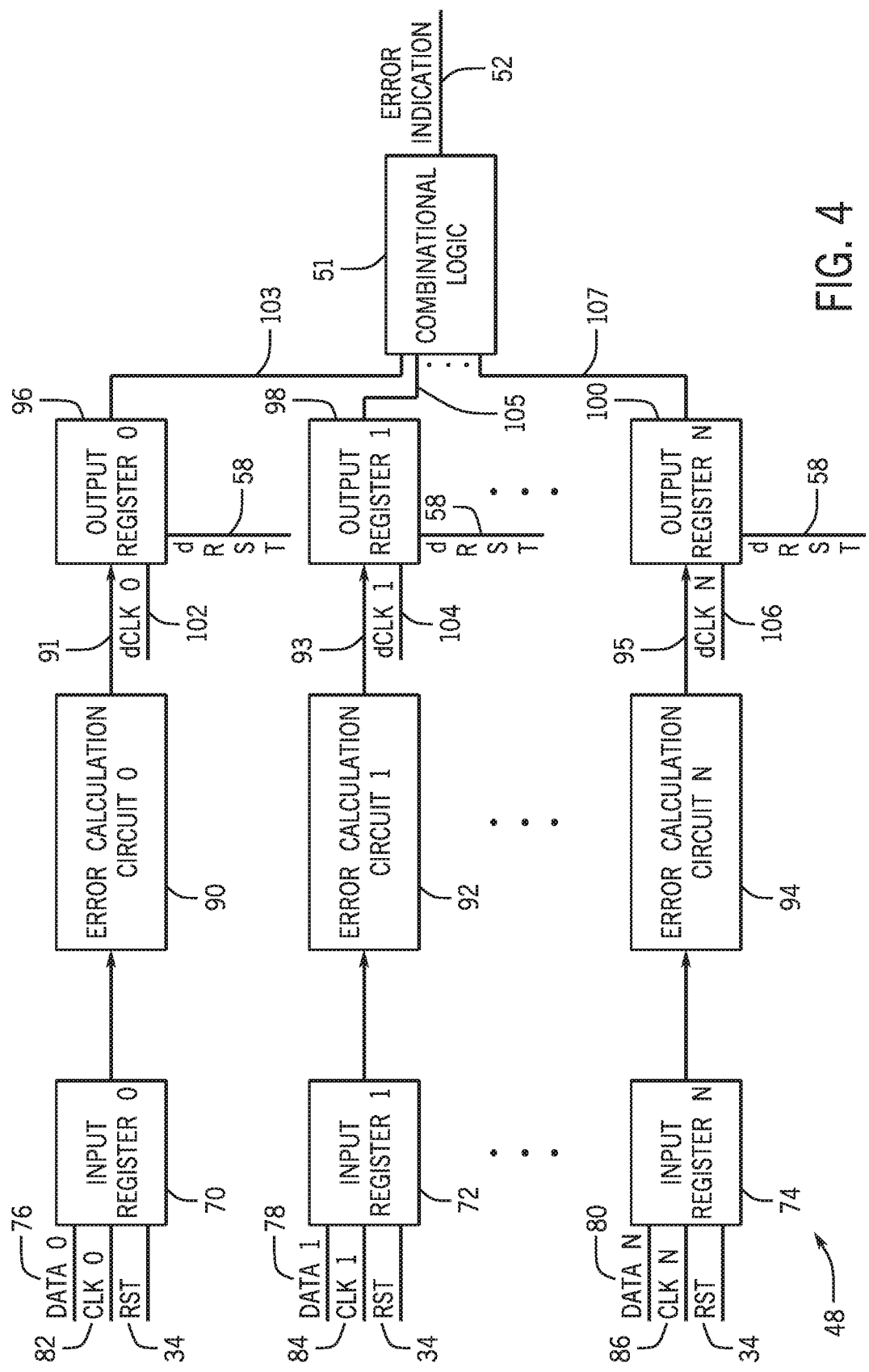
FIG. 4 is a simplified block diagram of the parallel error calculation circuitry of FIG. 3 with individual delayed reset signals, in accordance with an embodiment.

FIG. 4 is a simplified block diagram of parallel error calculation circuitry 48. As illustrated, the parallel error calculation circuitry 48 includes input registers 70, 72, and 74 that respectively receive data0 76, data1 78, and dataN 80. The number, N, of input registers and data channels for the parallel error calculation circuitry 48 is equal to the number of calculation circuits included in the parallel error calculation circuitry 48. N may be selected at a value high enough to ensure that wrap-around of data and/or clocks while data is being processed in a calculation circuit, before data is passed into an input register, and/or before a respective indication 50 is passed out of the corresponding channel of the parallel error calculation circuitry 48.

Additionally, although the illustrated embodiment of the parallel error calculation circuitry 48 shows separate data inputs (e.g., data0 76, data1 78, and dataN 80) to each input register 70, 72, and 74, in some embodiments, the data 14 may be transmitted to each of the input registers 70, 72, and 74, but the input registers 70, 72, and 74 latch in respective data using the input clocks 54. Alternatively, the separate data inputs may be generated using a signal splitter before being received by the input registers. Regardless of how the data is provided to the input registers 70, 72, and 74, the input registers 70, 72, and 74 may include latches that latch respective data using respective clocks, clk0 82, clk1 84, and clkN 86, where the clk0 82, clk1 84, and clkN 86 are individual clocks of the input clocks 54 from the input counter 53. In other words, the input register 70 receives the data0 76 and latches the data in on a pulse of the clk0 82 that corresponds to a first pulse of the clock 32 due to the input counter 53 counting out the pulse of the clk0 82 as the first pulse. On a next pulse of the clock 32, the input counter 53 counts out a pulse on the clk1 84 to cause the input register 72 to latch in the data1 78. Similarly, on an Nth pulse, the input counter 53 counts out a pulse of the clkN 86 to cause the input register 74 to latch in the dataN 80.

When the input register 70 latches in the data0 76, the input register 70 transmits the data0 76 to an error calculation circuit 90. Similarly, when the input register 72 latches in the data1 78, the input register 72 transmits the data1 78 to an error calculation circuit 92. Also, when the input register 74 latches in the dataN 80, the input register 74 transmits the dataN 80 to an error calculation circuit 94. The error calculation circuits 90, 92, and 94 may include any suitable error calculation mechanism, such as parity calculators, CRC calculators, ECC calculators, checksum calculators, or other calculators corresponding to the error checking type of the error checking circuitry 18.

Once the error calculation circuit 90 processes the data0 76, the error calculation circuit 90 outputs an error indicator 91 that indicates whether the error calculation circuit 90 detected any errors in the data0 76. Similarly, once the error calculation circuit 92 processes the data1 78, the error calculation circuit 92 outputs an error indicator 93 that indicates whether the error calculation circuit 92 detected any errors in the data1 78. Furthermore, once the error calculation circuit 94 processes the dataN 80, the error calculation circuit 94 outputs an error indicator 95 that indicates whether the error calculation circuit 94 detected any errors in the dataN 80.

Although the error calculation circuits 90, 92, and 94 may be free-flowing, the error indicators 91, 93, and 95 may be gated using output registers 96, 98, and 100. As previously discussed, the parallel error calculation circuitry 48 receives the output clocks 46 to delay output of the output registers 96, 98, and 100 until enough time has elapsed for the error calculation circuits 90, 92, and 94 to have completed processing of their respective data. In other words, the output clocks 46 include the dclk0 102, the dclk1 104, and the dclkN 106. As previously noted, the dclk0 102 corresponds to the clk0 82, where the dclk0 102 and the clk0 82 are generated from the same pulse of the clock 32, but the dclk0 102 is delayed by a duration set by the delay model 40 that is set as a worst case scenario duration of processing of the error calculation circuit 90 and/or the error calculation circuits 92 and 94 plus a fine tuning delay.

For example, since the clk0 82 and the dclk0 102 have a duration set as a worst case scenario, gating the error indicator 91 ensures that incomplete/incorrect outputs from the error calculation circuit 90 are not inadvertently passed out of the parallel error calculation circuitry 48 causing false positives or false negatives on the error indicator 52. Thus, the output register 96 uses the dclk0 102 to ensure that a correct value is output as an error indicator 103 is transmitted to the combinational logic 51 to generate the error indication signal 52 at a correct time. Similar to the output register 96, the output register 98 gates the error indicator 93 using a dclk1 104 to time indicator 105. The dclk1 104 is received by the output register 96 from the output counter 44 and corresponds to the clk1 84. Likewise, the output register 100 gates the error indicator 95 using a dclkN 106 to time indicator 107. The dclkN 106 is received by the output register 100 from the output counter 44 and corresponds to the clkN 86. In other words, the parallel error calculation circuitry 48 includes multiple channels that each include an input register, an error calculator, and an output register. The channel receives data using the input clocks 54 via its respective input register, calculates whether an error is detected, and outputs an error indicator (e.g., error indicator 91) from the channel via the channel's output register using the output clocks 46.

Figure 5:
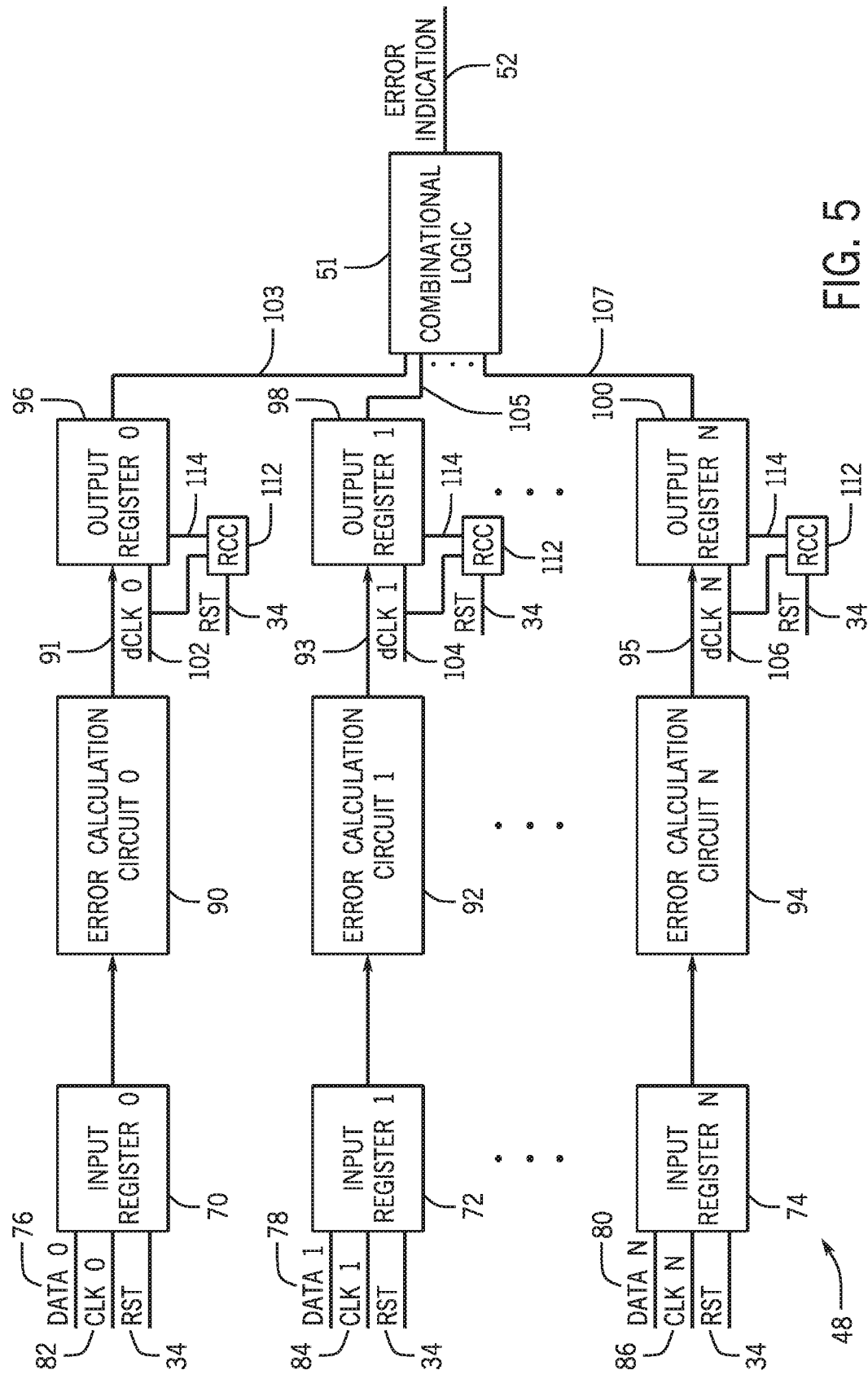
FIG. 5 is a simplified block diagram of the parallel error calculation circuitry of FIG. 3 with a common undelayed reset signal and reset control circuitry, in accordance with an embodiment.

The output registers 96, 98, and 100 may be reset using a delayed reset signal 58. In some embodiments, the output registers 96, 98, and 100 may receive a common delayed reset signal 58. In some embodiments, the delayed reset signal 58 may be foregone instead relying on the undelayed reset signal 34. However, in such embodiments, the parallel error calculation circuitry 48 may determine whether a reset signal 34 conflicts with a delayed clock at an output register 96, 98, or 100. To account for this conflict while foregoing the delayed reset signal 58, additional logic may be included in the parallel error calculation circuitry 48. For example, as illustrated in FIG. 5, reset control circuitry 112 may be included in the parallel error calculation circuitry 48 to control whether the reset signal 34 is passed to the output registers 96, 98, or 100. In some embodiments, each output register has a corresponding reset control circuitry 112 creating controlled reset signals 114 based on corresponding clock signals (e.g., dclk0 102, dclk1 104, or dclkN 106). Alternatively, a single reset control circuitry 112 may control whether a controlled reset signal 114 is supplied to more than one (e.g., all) of the output registers. For instance, a single reset control circuitry 112 may gate the reset signal 34 using the delayed clock 42. In some embodiments, each single reset control circuitry 112 may include circuitry (e.g., a multiplexer) that provides the reset signal 34 to the corresponding output register(s) unless a corresponding delay clock is simultaneously asserted.

Figure 6:
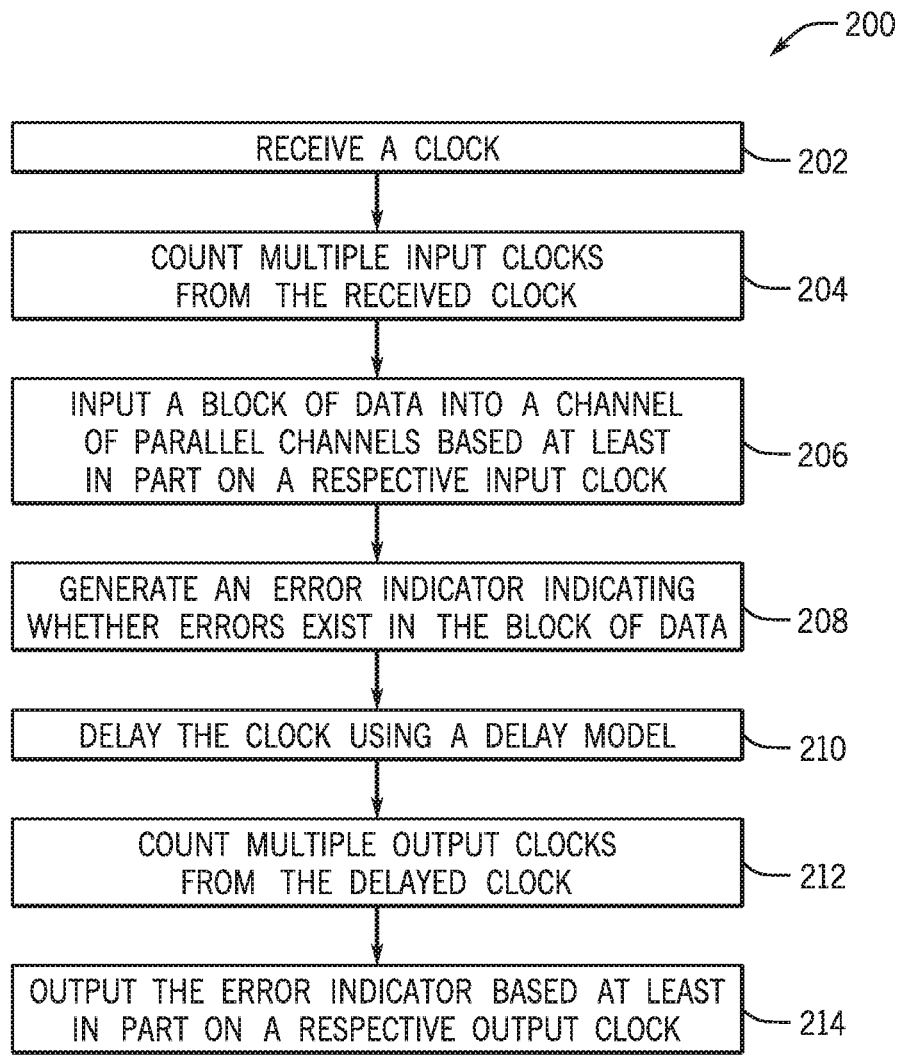
FIG. 6 is a flow diagram of processing error calculations in parallel channels of the parallel error calculation circuitry of FIG. 3, in accordance with an embodiment.

FIG. 6 is a flow diagram of a process 200 that may be used by the error checking circuitry 18 in accordance with the foregoing disclosure. The error checking circuitry receives the clock 32 to be used to time error checking in the error checking circuitry (block 202). The input counter 44 counts out multiple input clocks 46 from the clock 32 (block 204). In some embodiments, the input counter 44 may be a clock divider that divides the clock 32 into the multiple input clocks 46. A channel of the inputs a block of the data-to-be-checked into a channel of multiple parallel channels of the error checking circuitry 18 based at least in part on a respective input clock of the multiple input clocks (block 206). For example, the input register 70 may latch in the block (e.g., data0 76) in response to the clk0 82. The channel then generates an error indicator (e.g., error indicator 91) by checking for errors in the input block of data and indicating whether an error was detected in the input block of data (block 208). The delay model 40 also generates a delayed clock 42 from the clock 32 (block 210). As previously discussed, the delay model 40 may emulate (e.g., using copied hardware) a slowest path in the channel. Additionally, in some embodiments, the delay model 40 may include the tuning circuitry 56 to add additional delays to account for various factors, such process differences.

The output counter 44 counts out multiple output clocks 46 from the delayed clock 42 (block 212). The channel outputs the error indicator (e.g., error indicator 91) from the channel based on a respective output clock of the multiple output clocks (block 214). For instance, the output register 96 may gate the error indicator 91 until the dclk0 102 is received at the output register 96. Since the respective output clock corresponds to the respective input clock with delays, the respective output clock ensures that the error indicator is not prematurely output thereby potentially causing incorrect values for the error indicator.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device, comprising:
  error checking circuitry configured to receive a clock and reset, wherein the error checking circuitry comprises:

an input counter that is configured to receive the clock and to count out a plurality of input clocks from the clock;
a delay model that is configured to receive the clock and to output a delayed clock;
an output counter that is configured to receive the delayed clock and to count out a plurality of output clocks from the delayed clock; and
a plurality of error calculation circuits arranged in parallel that each are configured to:
receive a respective input clock of the plurality of input clocks;
receive data based on the respective input clock;
receive a respective output clock of the plurality of output clocks;
generate an error indicator based on the data, wherein the error indicator indicates whether an error exists in the data; and
output the error indicator based at least in part on the respective output clock of the plurality of output clocks.

2. The semiconductor device of claim 1, wherein the semiconductor device comprises a memory device.

3. The semiconductor device of claim 1, wherein the error checking circuitry comprises a plurality of input registers each configured to:
receive the data; and
transmit the data to a respective error calculation circuit of the plurality of error calculation circuits upon receipt of a respective input clock of the plurality of input clocks.

4. The semiconductor device of claim 3, wherein each of the plurality of input registers is configured to receive each block of the data with only one respective input register of the plurality of input registers transmitting a respective block of the data to a respective error calculation circuit upon receipt of the respective input clock.

5. The semiconductor device of claim 1, wherein the error checking circuitry comprises a plurality of output registers each configured to:
receive a respective output indicator from a respective error calculation circuit; and
output a gated output indicator based at least in part on the respective output indicator and a respective output clock of the plurality of output clocks.

6. The semiconductor device of claim 5, wherein the delay model is configured to receive a reset signal, to delay the reset signal, and to output a delayed reset signal, and at least one of the plurality of output registers is configured to be reset based at least in part on the delayed reset signal.

7. The semiconductor device of claim 5, wherein each of the plurality of output registers is configured to receive a reset signal from a respective reset control circuitry that is configured to receive a reset signal and the respective delayed clock to the plurality of output clocks.

8. The semiconductor device of claim 1, wherein the delay model comprises programmable tuning circuitry that comprises a selectable number of gates configured to provide additional delays to account for process differences.

9. The semiconductor device of claim 1, wherein the input counter is configured to count out the plurality of input clocks by successively outputting a single pulse on a respective input clock of the plurality of input clocks in response to a pulse of the clock, and the output counter is configured to count out the plurality of output clocks by successively outputting a single pulse on a respective output clock of the plurality of output clocks in response to a pulse of the delayed clock.

10. The semiconductor device of claim 9, wherein a pulse of an input clock of the plurality of input clocks corresponds to a pulse of a corresponding output clock of the plurality of output clocks, wherein the pulse of the corresponding output clock occurs after a delay period after the pulse of the input clock, wherein the delay period is equal to an amount of delay introduced by the delay model.

11. A method comprising:
receiving a clock at error checking circuitry to be used to time error checking in the error checking circuitry;
counting out a plurality of input clocks from the clock using an input counter;
transmitting the plurality of input clocks to respective channels of a plurality of parallel channels of the error checking circuitry;
inputting a block of data to be checked into a channel of the respective channels of the plurality of parallel channels of the error checking circuitry based at least in part on a respective input clock of the plurality of input clocks;
generating an error indicator by checking for errors in the block of data and indicating whether an error was detected in the block of data;
generating a delayed clock by delaying the clock using a delay model;
counting out a plurality of output clocks from the delayed clock using an output counter;
transmitting the plurality of input clocks to the respective channels of the plurality of parallel channels of the error checking circuitry; and
outputting the error indicator from the channel based on a respective output clock of the plurality of output clocks.

12. The method of claim 11, wherein delaying the clock using the delay model comprises transmitting the clock through delay model circuitry that emulates a slowest path of at least one of the plurality of parallel channels.

13. The method of claim 12, wherein delaying the clock using the delay model comprises adding tuning delays using additional gates configured to account for process differences.

14. The method of claim 11, wherein a subsequent block of data is error checked in another channel of the plurality of parallel channels before the error indicator is output from the channel.

15. The method of claim 11, wherein inputting the block of data comprises latching the block of data using an input register of the channel in response to the respective input clock.

16. The method of claim 11, wherein outputting the error indicator from the channel comprises latching the error indicator using an output register of the channel in response to the respective output clock.

17. An electronic device, comprising:
an input counter that is configured to receive a clock and to count out a plurality of input clocks from the clock;
a delay model that is configured to receive the clock and to output a delayed clock;
an output counter that is configured to receive the delayed clock and to count out a plurality of output clocks from the delayed clock; and
a plurality of error checking channels arranged in parallel, wherein the delay model is configured to model a slowest path through the error checking channels and each of the plurality of error checking channels is configured to:

receive a respective input clock of the plurality of input clocks;

receive a respective output clock of the plurality of output clocks;

receive a block of data based on the respective input clock of the plurality of input clocks;

generate an error indicator based on the block of data, wherein the error indicator indicates whether an error exists in the data; and output the error indicator based at least in part on a respective output clock of the plurality of output clocks.

18. The electronic device of claim 17, wherein each of the plurality of error checking channels comprises an input register that is configured to control when the block of data is latched into the respective error checking channel based at least in part on a respective input clock of the plurality of input clocks.

19. The electronic device of claim 18, wherein each of the plurality of error checking channels comprises an output register that is configured to control when a respective error indicator is latched out of the respective error checking channel based at least in part on a respective output clock of the plurality of output clocks.

20. The electronic device of claim 19, wherein each of the plurality of error checking channels comprises an error calculator configured to receive the block of data from a respective input register, to generate the error indicator on the block of data, and to output the error indicator to a respective output register.

* * * * *